United States Patent
Jian et al.

(10) Patent No.: US 10,686,424 B2
(45) Date of Patent: Jun. 16, 2020

(54) DUPLEXER

(71) Applicant: Telefonaktiebolaget LM Ericsson (publ), Stockholm (SE)

(72) Inventors: Chunyun Jian, Ottawa (CA); Somsack Sychaleun, Ottawa (CA)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 30 days.

(21) Appl. No.: 15/771,629

(22) PCT Filed: Nov. 12, 2015

(86) PCT No.: PCT/IB2015/058758
§ 371 (c)(1),
(2) Date: Apr. 27, 2018

(87) PCT Pub. No.: WO2017/081517
PCT Pub. Date: May 18, 2017

(65) Prior Publication Data
US 2018/0331671 A1    Nov. 15, 2018

(51) Int. Cl.
*H03H 7/46* (2006.01)
*H04B 1/525* (2015.01)
*H03H 7/01* (2006.01)

(52) U.S. Cl.
CPC .......... *H03H 7/463* (2013.01); *H04B 1/525* (2013.01); *H03H 2007/013* (2013.01)

(58) Field of Classification Search
CPC ... H03H 7/463; H03H 2007/013; H04B 1/525
USPC .......................................................... 455/73
See application file for complete search history.

(56) References Cited

U.S. PATENT DOCUMENTS

| | | | |
|---|---|---|---|
| 7,616,058 B1* | 11/2009 | Nezakati | H03F 3/211 330/124 R |
| 7,623,005 B2 | 11/2009 | Johansson et al. | |
| 7,941,187 B2 | 5/2011 | Kim et al. | |
| 8,022,787 B2 | 9/2011 | Inoue et al. | |
| 8,046,027 B2 | 10/2011 | Kim et al. | |

(Continued)

FOREIGN PATENT DOCUMENTS

| | | |
|---|---|---|
| JP | 2003008305 A1 | 10/2003 |
| WO | 2006/121402 A1 | 11/2006 |

OTHER PUBLICATIONS

International Search Report and Written Opinion of the International Searching Authority dated Jul. 14, 2016 issued in corresponding PCT Application Serial No. PCT/IB2015/058758 consisting of 12 pages.

*Primary Examiner* — Ankur Jain
(74) *Attorney, Agent, or Firm* — Christopher & Weisberg, P.A.

(57) ABSTRACT

Duplexers for high power applications are disclosed. In some embodiments, a duplexer includes 2N band pass filters, where N is an integer greater than 1. The 2N band pass filters each have an input and an output and are in an electrically parallel configuration. The duplexer includes a first adaptation circuit configured to couple a transmit signal received from a transmitter to each one of the 2N band pass filters. The duplexer includes a second adaptation circuit configured to couple outputs of the 2N band pass filters to an antenna, the second adaptation circuit providing an isolated path between the antenna and a receiver.

12 Claims, 11 Drawing Sheets

(56) References Cited

U.S. PATENT DOCUMENTS

| | | |
|---|---|---|
| 8,600,330 B2 | 12/2013 | Schmidt |
| 8,654,685 B2 | 2/2014 | Kim et al. |
| 8,750,173 B2 | 6/2014 | Knox |
| 9,042,275 B2 | 5/2015 | Bauder et al. |
| 9,048,805 B2 | 6/2015 | Granger-Jones et al. |
| 2008/0136530 A1* | 6/2008 | Salomon ................ H03F 3/604 330/306 |
| 2011/0069644 A1 | 3/2011 | Kim et al. |
| 2013/0083703 A1* | 4/2013 | Granger-Jones ....... H04B 1/525 370/277 |
| 2013/0122831 A1* | 5/2013 | Desclos ................... H04B 1/44 455/78 |
| 2013/0234806 A1* | 9/2013 | Schmidhammer ...... H01P 1/213 333/133 |
| 2013/0321097 A1* | 12/2013 | Khlat ....................... H01P 5/12 333/117 |
| 2015/0085724 A1 | 3/2015 | Khlat et al. |
| 2015/0117280 A1 | 4/2015 | Khlat et al. |
| 2015/0118978 A1 | 4/2015 | Khlat |
| 2015/0163044 A1 | 6/2015 | Analui et al. |
| 2015/0222300 A1 | 8/2015 | Schmidhammer et al. |
| 2015/0236842 A1 | 8/2015 | Goel et al. |

\* cited by examiner (Prior Art)
FIG. 2

DUPLEXER

CROSS-REFERENCE TO RELATED APPLICATIONS

This application is a Submission Under 35 U.S.C. § 371 for U.S. National Stage Patent Application of International Application Number: PCT/IB2015/058758, filed Nov. 12, 2015 entitled "DUPLEXER" which is incorporated herein by reference.

TECHNICAL FIELD

Wireless communications and in particular, duplexer designs for wireless transceivers.

BACKGROUND

Figure 1:
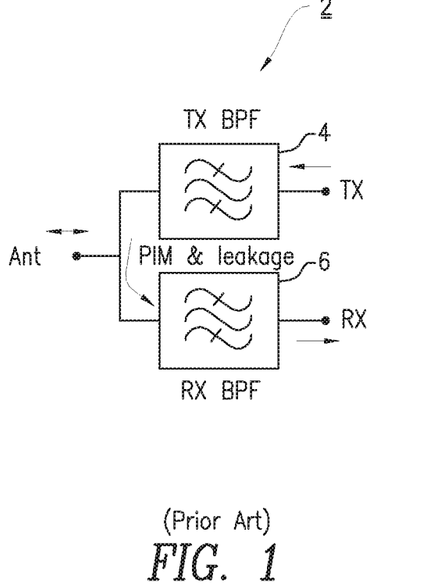
FIG. 1 is a schematic of a known duplexer configuration.

A duplexer is a radio frequency (RF) component in an RF front end of a radio transceiver used in base stations and wireless devices in a wireless communication system. FIG. 1 shows a well-known duplexer design 2 used in many transceivers. The duplexer 2 has a transmit band pass filter (BPF) 4 and a receive BPF 6. The transmit BPF 4 is connected to a transmitter and is configured to pass signals having frequencies in the transmit frequency band F1, while rejecting signals at other frequencies, including rejecting signals at the receive frequency band F2. The receive BPF 6 is connected to a receiver and is configured to pass signals having frequencies in the receive frequency band F2, while rejecting signals at other frequencies, including rejecting signals at the transmit frequency band F1. Both BPFs 4 and 6 are connected to an antenna. Ideally, transmit signals in the transmit frequency band F1 from the transmitter are passed through the transmit BPF 4 to the antenna but are blocked from reaching the receiver by the receive BPF 6. Likewise, signals received by the antenna in the receive frequency band F2 are passed by the receive BPF 6 but blocked by the transmit BPF 4.

In reality, no BPF provides perfect isolation of out-of-band signal frequencies so that some of the transmit energy from the transmitter will leak through the BPF 6 into the receiver. Further, passive intermodulation (PIM) generated by the transmit BPF 4 may pass the receive BPF 6 and be received by the receiver. Note that since the transmit BPF 4 and the receive BPF 6 are directly connected at the antenna port, a stringent out of band attenuation requirement must be met in order to limit this leakage. Further, the power-handling capability of this type of duplexer design is mainly determined by the transmit BPF design.

Currently, only two types of small duplexers are commercially available: an acoustic type and a ceramic type. The acoustic type may be a surface acoustic wave (SAW), bulk acoustic wave (BAW) or film bulk acoustic resonator (FBAR). The ceramic type includes monoblock duplexers and ceramic coaxial duplexers. Whether the acoustic type or the ceramic type is used may depend on the power handling requirements of the transceiver and the maximum leakage tolerable at the receiver. The choice further depends on size, cost and weight constraints.

In general, for a radio design with transmit power averaging less than about 23 dBm, the acoustic type duplexers can meet entire performance requirements of the handset designs, but cannot fully meet the performance requirements of some base stations such as small cell base station designs. Some base stations require very high isolation between the transmit and receive ports, especially in the cases of high transmit power, which have not been achievable by acoustic type duplexer designs, and consequently, ceramic filters are typically used in these cases.

A disadvantage of ceramic filters is their size. A typical ceramic type duplexer may be of the dimensions of 52×14×6 millimeters (mm), whereas a typical acoustic type duplexer may be of the dimensions 2×1.6×0.6 mm. Hence, a typical ceramic type duplexer may be over 2000 times larger than an acoustic type duplexer. In addition to large size, ceramic type duplexers may be 100 times heavier and 10 times more costly than acoustic type duplexers. Further, acoustic type duplexers have Q factor that may be three times greater than the Q factor of ceramic type duplexers. A Q factor is an indication of energy stored by a resonator divided by energy dissipated per cycle.

Advantage to the ceramic type duplexers over other designs include much higher transmit power handling capability and lower PIM at the receive port for the same power handling. Therefore, designs for high power with low PIM requirements may be limited to ceramic duplexers.

Figure 2:
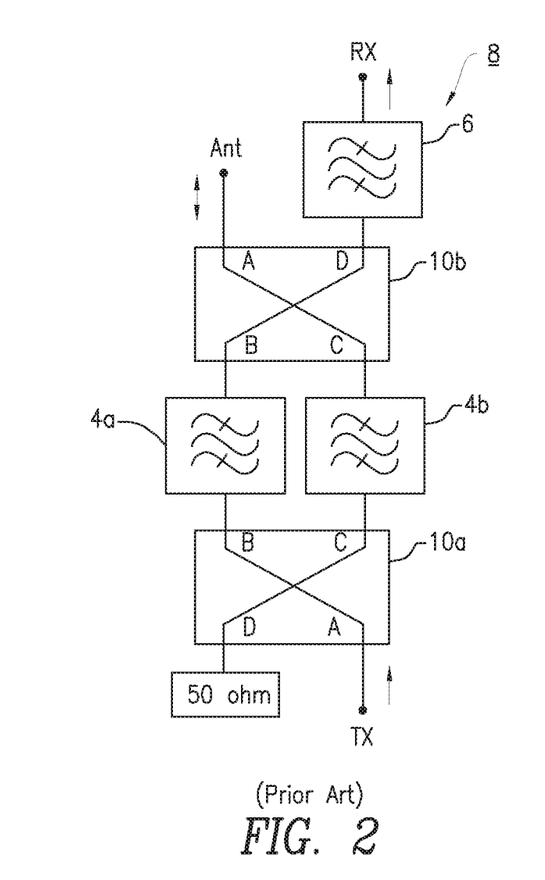
FIG. 2 is a schematic of a known duplexer configuration for higher isolation between the transmit and receive ports.

FIG. 2 shows a duplexer design 8 that can be used for higher power applications. The duplexer 8 has two electrically parallel transmit BPFs 4a and 4b, referred to collectively as BPFs 4, a receive BPF 6, and two 90° hybrid couplers 10a and 10b referred to collectively herein as hybrid couplers 10. A 90° hybrid coupler is a four port device that is used either to equally split an input signal into two paths or to combine two signals while maintaining isolation between them.

For example, the 90° hybrid coupler 10a splits the input from the transmitter at port A into two equal magnitude signals that are output at ports B and C. In this example, port D is terminated with a 50 ohms load. Each output of the 90° hybrid coupler 10a is input to a different transmit BPF 4. Each BPF 4 has a substantially identical band pass response configured to pass signals at a transmit frequency band F1. Each transmit BPF 4 is output to one of the inputs of the 90° hybrid coupler 10b via ports B and C.

The 90° hybrid coupler 10b combines the inputs at ports B and C and outputs the combined signal at port A to an antenna. A signal received from the antenna is received at port A and split to two paths towards ports B and C, respectively. The split two signals are reflected at the ports B and C, and the reflected signals are combined at port D, which is coupled via the receive BPF 6 to a receiver. Since two band pass filters are used to filter the transmit signal, this type of duplexer might handle twice the transmit power of a duplexer having only one transmit BPF. Also, due to signal cancellation provided by the 90° hybrid couplers 10, this type of duplexer has much lower PIM at its receive port and much higher isolation between the transmit and receive ports of the duplexer as compared to the duplexer of FIG. 1.

However, if the two BPFs 4 were designed in SAW, BAW or FBAR filter technology, the balanced duplexer design of FIG. 2 can handle only twice the power of the duplexer design of FIG. 1 which is inadequate to meet the demands of a wide range of high power applications. Thus, in many cases, the bulky, heavy and expensive ceramic type duplexers are still used.

SUMMARY

The present embodiments advantageously provide duplexers that utilize filters such as acoustic wave, low temperature co-fired ceramic (LTCC) and other small form factor filters. According to one aspect, some embodiments include a duplexer for coupling between a transmitter and an antenna and for coupling between the antenna and a receiver. The duplexer includes 2N band pass filters, where N is an integer greater than 1. The 2N band pass filters each have an input and an output and are in an electrically parallel configuration. The duplexer includes a first adaptation circuit configured to couple a transmit signal received from a transmitter to each one of the 2N band pass filters. The duplexer includes a second adaptation circuit configured to couple outputs of the 2N band pass filters to an antenna, the second adaptation circuit providing a reflective path between an antenna and a receive port of the duplexer.

According to this aspect, in some embodiments, the first adaptation circuit includes a 90° hybrid coupler having at least one input and at least two outputs and configured to couple the transmit signal toward the 2N band pass filters. In some embodiments, each band pass filter has an impedance of $Z_0$ ohms and the 90° hybrid coupler has an impedance of $Z_0/N$ ohms. In some embodiments, the duplexer further includes a quarter-wave transmission line between the transmitter and the hybrid coupler, the quarter-wave transmission line having a characteristic impedance of $\sqrt{(Z_{in}*Z_o)/N}$, where $Z_{in}$ is an input impedance of the transmitter. In some embodiments, the first adaptation circuit further includes a splitter circuit configured to direct an output of the 90° hybrid coupler to each of a plurality of the 2N band pass filters. In some embodiments, the splitter circuit includes a first splitter having N output ports and a second splitter having N output ports, each splitter receiving as an input an output of the 90° hybrid coupler. In some embodiments, the second adaptation circuit includes a 90° hybrid coupler configured to receive outputs of the 2N band pass filters, and to couple the received outputs to the antenna. In some embodiments, the second adaptation circuit includes a combiner circuit having a plurality of input ports, each input port receiving an output of one of a plurality of the 2N band pass filters. In some embodiments, the combiner circuit includes a first combiner having N input ports coupled to a first set of N output ports of the 2N band pass filters, and a second combiner having N input ports coupled to a second set of N output ports of the 2N band pass filters. In some embodiments, the first adaptation circuit includes a 90° hybrid coupler having at least two outputs and configured to receive the transmit signal, a splitter circuit configured to receive outputs of the 90° hybrid coupler, and an impedance transformer interposed between the 90° hybrid coupler and the splitter circuit to transform an impedance of the 90° hybrid coupler to an impedance of the splitter circuit. In some embodiments, the band pass filters are acoustic wave band pass filters, and in some embodiments the band pass filters are low temperature co-fired ceramic, LTCC, filters.

According to another aspect, some embodiments include a duplexer for coupling between a transmitter and an antenna and for coupling between the antenna and a receiver. The duplexer includes a plurality of band pass filters in an electrically parallel configuration and each band pass filter having an input and an output. The duplexer also includes a first adaptation circuit configured to direct a transmit signal to the plurality of band pass filters. The duplexer also includes a second adaptation circuit configured to direct outputs of the band pass filters to the antenna while providing a reflective path between the antenna and the receiver.

According to this aspect, in some embodiments, the first adaptation circuit includes a first 90° hybrid coupler configured to receive the transmit signal at an input port and output the transmit signal at a first output port and a second output port. The first adaptation circuit also includes a first splitter configured to receive a first output from the first output port and split the first output to a first plurality of paths, each path being coupled to a different one of a first set of the band pass filters. A second splitter is configured to receive a second output from the second output port, and split the second output to a second plurality of paths, each path being coupled to a different one of a second set of the band pass filters. In some embodiments, the duplexer further includes an impedance transformer positioned between the first 90° hybrid coupler and the first splitter to match an impedance of the first 90° hybrid coupler to an impedance of the first splitter. In some embodiments, the duplexer further includes an impedance transformer positioned between the first 90° hybrid coupler and the second splitter to match an impedance of the 90° hybrid coupler to an impedance of the second splitter.

In some embodiments, the second adaptation circuit includes a second 90° hybrid coupler having two input ports and two output ports, one output port configured to be coupled to the antenna and the other output port configured to be coupled to the receiver. A first combiner is configured to receive at each of a first plurality of inputs, an output of an band pass filter, and combine the received first plurality of inputs to produce an input to a first one of the two input ports of the second 90° hybrid coupler. A second combiner is configured to receive at each of a second plurality of inputs, an output of an band pass filter, and combine the received second plurality of inputs to produce an input to the second one of the two input ports of the second 90° hybrid coupler.

According to some embodiments, the duplexer further includes an impedance transformer positioned between the second 90° hybrid coupler and the first combiner to match an impedance of the second 90° hybrid coupler to an impedance of the first combiner. In some embodiments, the duplexer further includes an impedance transformer positioned between the first 90° hybrid coupler and the second combiner to match an impedance of the 90° hybrid coupler to an impedance of the second combiner. In some embodiments, the band pass filters include $2^N$ band pass filters, and wherein the first adaptation circuit includes N stages of 90° hybrid couplers. In some embodiments, the second adaptation circuit includes N stages of 90° hybrid couplers. In some embodiments, the plurality of band pass filters are acoustic wave band pass filters, and in some embodiments the plurality band pass filters are low temperature co-fired ceramic, LTCC, filters.

According to another aspect, a duplexer includes a first 90° hybrid coupler configured to be coupled to a transmitter and a load, the first 90° hybrid coupler having at least one output. The duplexer includes a second 90° hybrid coupler configured to be coupled to a receiver and to an antenna, the second 90° hybrid coupler having at least one input. A transmit band pass filtering circuit includes a plurality of band pass filters in an electrically parallel configuration, each band pass filter having an input and an output. The duplexer includes a first circuit interconnecting the first 90° hybrid coupler and the transmit band pass filtering circuit and a second circuit interconnecting the second 90° hybrid coupler and the transmit band pass filtering circuit.

According to this aspect, in some embodiments, the first circuit includes a splitter having an input coupled to an output of the first 90° hybrid coupler, the splitter having an output for each one of a plurality of the band pass filters. In some embodiments, the second circuit includes a combiner having an input for each one of the plurality of the band pass filters, the combiner having an output coupled to an input of the second 90° hybrid coupler. In some embodiments, the duplexer includes a first impedance matching circuit between the transmitter and the first 90° hybrid coupler and a second impedance matching circuit between the antenna and the second 90° hybrid coupler. In some embodiments, the plurality of band pass filters are acoustic wave band pass filters, and in some embodiments the plurality band pass filters are low temperature co-fired ceramic, LTCC, filters.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Before describing in detail exemplary embodiments, it is noted that the embodiments reside primarily in combinations of apparatus components and processing steps related to using acoustic filters in duplexers for high power transceivers such as those used in wireless communication base station equipment. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

In some embodiments, acoustic type band pass filters, such as SAW. BAW and FBAR band pass filters are used to design much smaller, lighter and cheaper duplexers than can be achieved with ceramic filters. In some embodiments, the acoustic type duplexers described herein can handle higher power with lower PIM and better Tx-Rx isolation than can be achieved with ceramic filters. Some embodiments described herein apply impedance matching technology for power splitting and combining. Of note, although this disclosure generally describes embodiments that use acoustic wave filters and duplexers based on acoustic wave filters, embodiments are not limited solely to the use of acoustic wave filters. It is contemplated that low temperature co-fired ceramic (LTCC) filters can be used as can other small form-factor filters.

Figure 3:
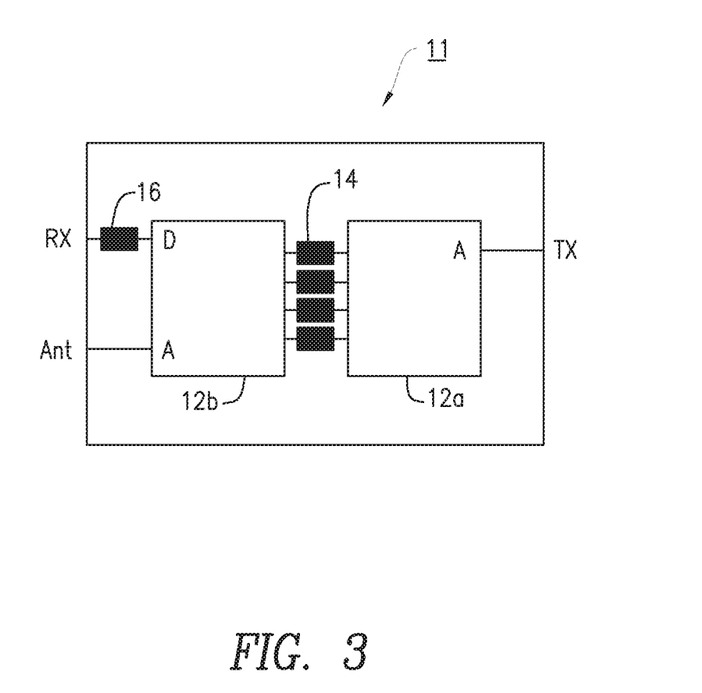
FIG. 3 is a block diagram of a duplexer configuration having two coupler modules with four transmit band pass filters (BPF)

FIG. 3 is a block diagram of a radio frequency (RF) duplexer constructed in accordance with principles described herein for use in a radio transceiver. An RF circuit board 11 has mounted thereon a first adaptation circuit 12a and a second adaptation circuit 12b, referred to collectively as adaptation circuits 12. In between the second adaptation circuit 12b and the first adaptation circuit 12a is a plurality of electrically parallel acoustic wave transmit BPFs 14. Although only four transmit BPFs 14 are shown, more transmit BPFs are included in some embodiments, as will be explained below. An acoustic wave receive BPF 16 couples an output D of the second adaptation circuit 12b to a receiver of the transceiver. An input A of the first adaptation circuit 12a is connected to the transmitter of the transceiver. The first adaptation circuit 12a is configured to couple a transmit signal from a transmitter to each of the acoustic wave transmit BPFs 14. The output A of the second adaptation circuit 12b is connected to an antenna and the output D of the second adaptation circuit 12b is connected to a receiver. The second adaptation circuit 12b is configured to couple the outputs of the acoustic wave transmit BPFs 14 to the antenna. The operation of the adaptation circuits is described in more detail below. The function of the first adaptation circuit 12a is generally to split the transmit signal to multiple ports of the transmit BPFs and to match the impedance of the transmitter output to the impedance of the transmit BPFs. Similarly, the function of the second adaptation circuit is generally to combine the signals from the transmit BPFs to the output to the antenna and to match the impedance of the transmit BPFs to the impedance of the antenna.

Figure 4:
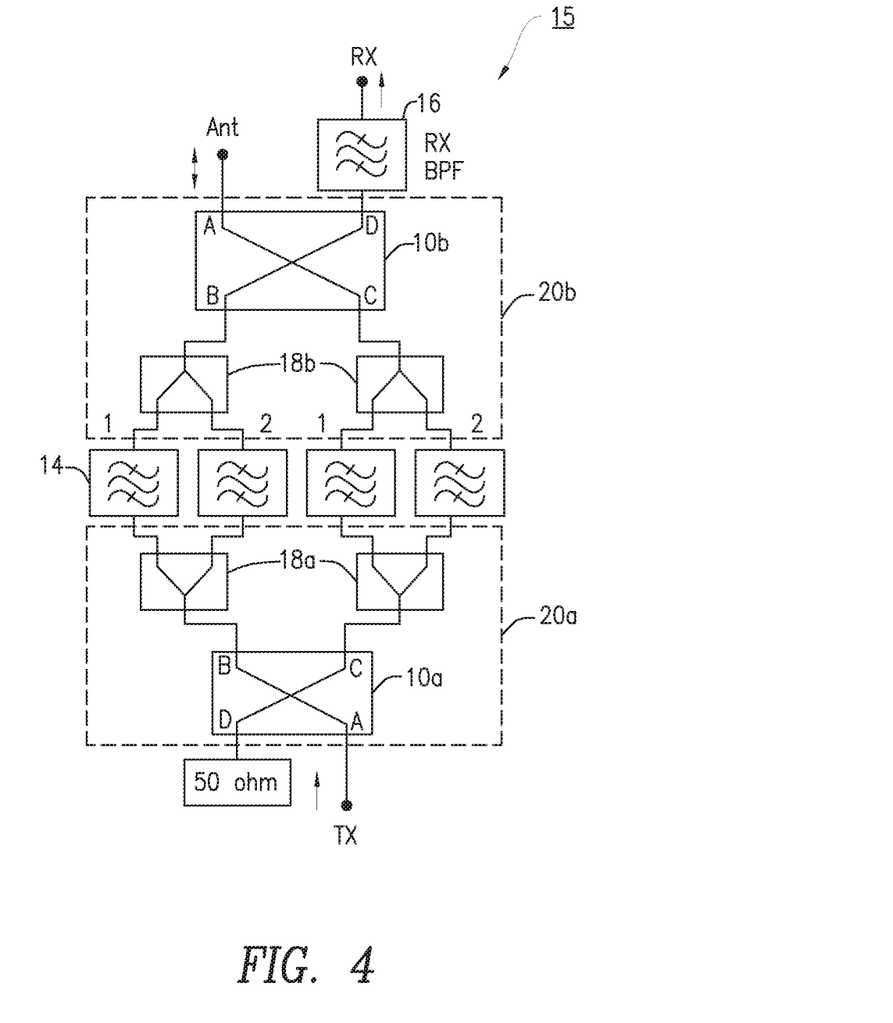
FIG. 4 is a schematic of an embodiment of a duplexer configuration having splitters and combiners.

FIG. 4 is a schematic diagram of one embodiment of a duplexer 15 having adaptation circuits 20a and 20b, referred to herein collectively as adaptation circuits 20, and four transmit BPFs 14. The adaptation circuits 20a and 20b are exemplary specific implementations of the coupler modules 12a and 12b. Adaptation circuit 20a has two 2-port splitters 18a and a 90° hybrid coupler 10a. Adaptation circuit 20b has two 2-port combiners 18b and a 90° hybrid coupler 10b. The splitters 18a couple the output ports B and C of the 90° hybrid coupler 10a to four transmit BPFs 14. The combiners 18b combine the outputs of the four transmit BPFs 14 and direct the combined outputs to input ports B and C of the 90° hybrid coupler 10b. The configuration of FIG. 4 has about four times the power handling capability as the configuration of FIG. 1 because of the use of four times the number of acoustic wave BPFs. Also, due to signal cancellation brought by the two 90° hybrid couplers 10a and 10b, the four equal power transmit signals output from the four transmit BPFs 14 will be cancelled at port D, resulting in improved isolation between the transmitter and receiver. Also, if there is any PIM generated by the four transmit BPFs 14 when passing the transmit signals, the PIM will cancel at the receive port D. Note that in this embodiment, the coupler 10a has an input coupled to a 50 ohm load and the 90° hybrid couplers 10a and 10b each have 50 ohm impedance. Note also that the designation of a 50 ohm load will be understood by persons of skill in the art to be approximately 50 ohms, since it is unlikely that a resistive product will necessarily be exactly 50 ohms.

Figure 5:
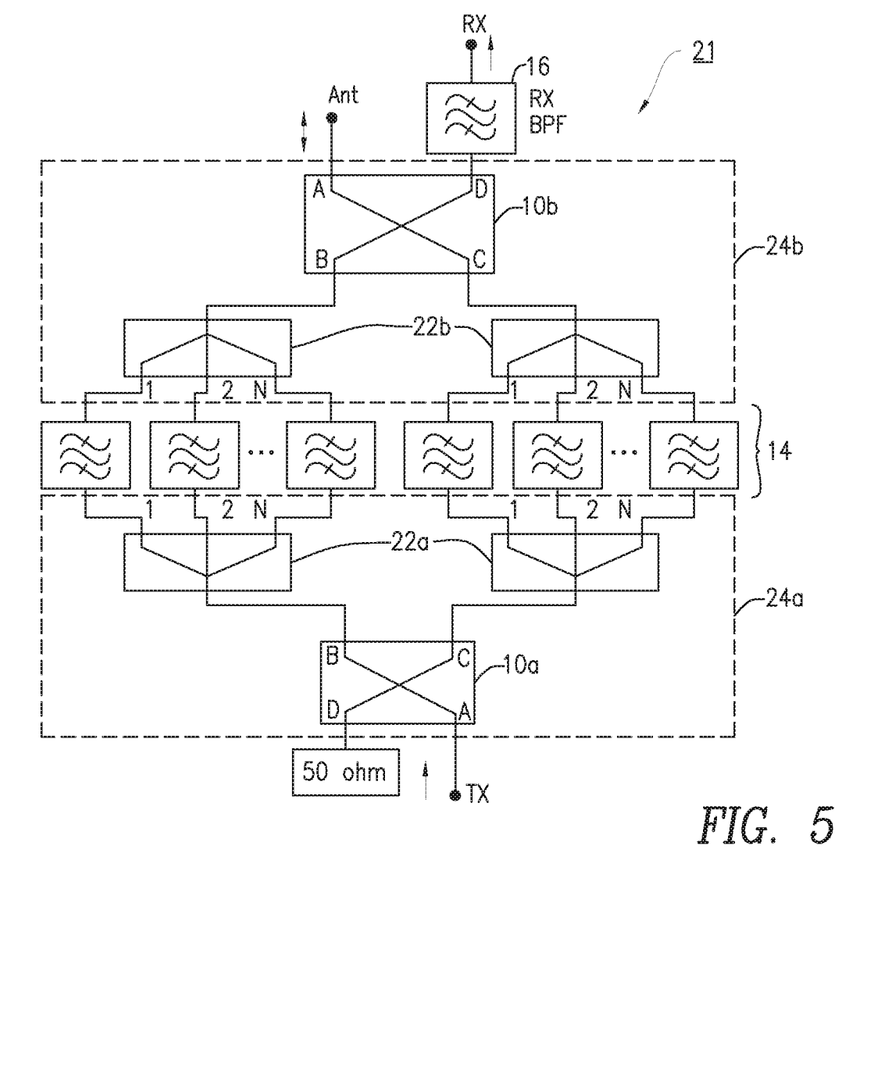
FIG. 5 is a schematic of an embodiment of a 2N-filter duplexer having 1:N splitters and combiners.

FIG. 5 is a schematic diagram of one embodiment of an acoustic type duplexer 21 having two adaptation circuits 24a and 24b, referred to herein collectively as adaptation circuits 24. The adaptation circuits 24a and 24b are exemplary specific implementations of the coupler modules 12a and 12b. The signal cancellation mechanism of the configuration of FIG. 5 is similar to the signal cancellation mechanism of the configuration of FIG. 4. The power handling capability of the configuration of FIG. 5 is about 2N times the power handling capability of the configuration of FIG. 1. In the embodiment of FIG. 5, adaptation circuit 24a has two N-port splitters 22a and adaptation circuit 24b has two N-port combiners 22b, where N is an integer greater than 1. Each of the two N-port splitters 22a splits an output of the 90° hybrid coupler 10a to N ports to feed N transmit BPFs 14, so that there are 2N transmit BPFs 14. Each of the two N-port combiners 22b combine N outputs of N transmit BPFs 14 to produce a single output that is fed to an input port of the 90° hybrid coupler 10b. Once again, the 90° hybrid coupler 10a is connected to a 50 ohm input impedance and the hybrid couplers 10a, 10b, 22a and 22b have a 50 ohm impedance.

Figure 6:
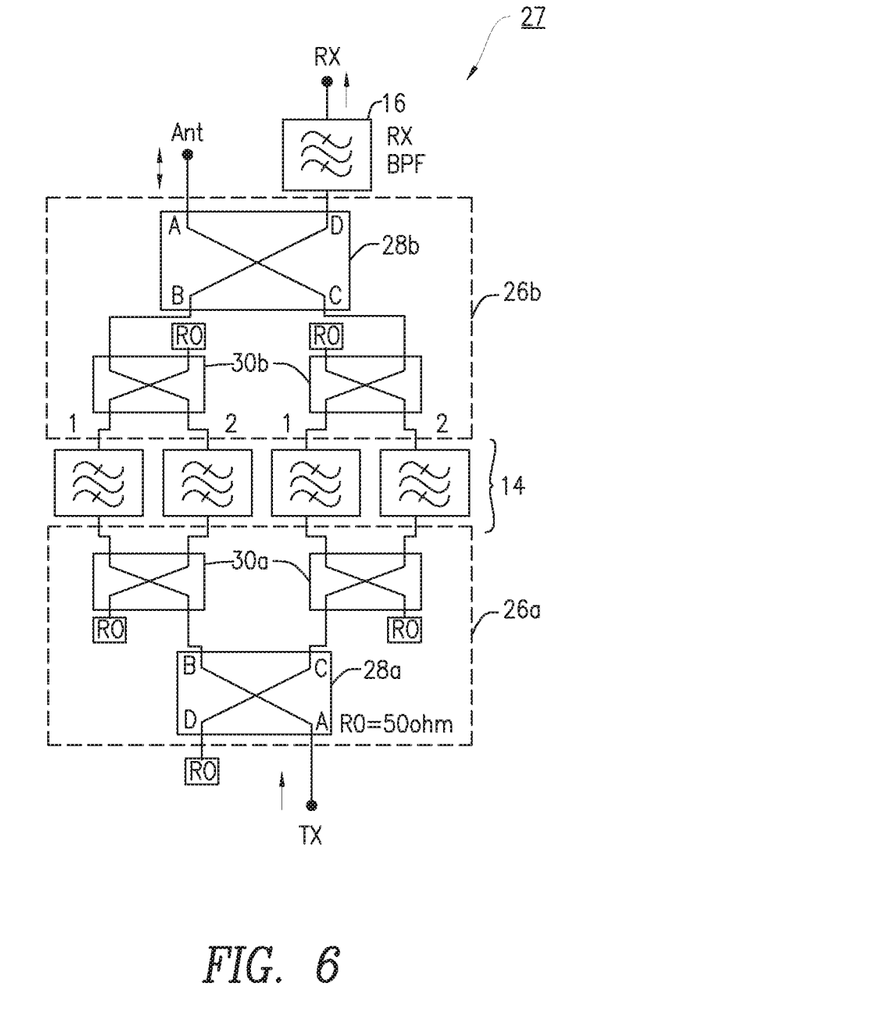
FIG. 6 is a schematic of an embodiment of a two-stage coupler type balanced duplexer having $2^2$ acoustic wave BPFs.

FIG. 6 is a schematic diagram of one embodiment of a two-stage coupler balanced duplexer 27 having four transmit BPFs 14 between adaptation circuits 26a and 26b. The adaptation circuits 26a and 26b are exemplary specific implementations of the coupler modules 12a and 12b. Adaptation circuit 26a has a first stage 90° hybrid coupler 28a which directs the transmitter input to two output ports B and C and two second stage 90° hybrid couplers 30a. The outputs on output ports B and C are each input to a different one of the two second stage 90° hybrid couplers 30a. The two outputs of each of the second stage 90° hybrid couplers 30a are input to the four transmit BPFs 14. The outputs of the 4 BPFs 14 are input to adaptation circuit 26b, which includes two stages of 90° hybrid couplers 28b and 30b. Specifically, the outputs of the four BPFs are input to one each of four inputs of the two second stage 90° hybrid couplers 30b. The outputs of the two second stage 90° hybrid couplers 30b are input to a final stage 90° hybrid coupler 28b which directs the two inputs of the 90° hybrid coupler 28b to the antenna. The power handling capability of the configuration of FIG. 6 is about four times the power handling capability of the configuration of FIG. 1 because the configuration of FIG. 6 uses four similar BPFs, and results in better isolation and lower PIM at the receive port D. An advantage to using two stages of 90° hybrid couplers rather than the splitters 18a and combiners 18b of FIG. 4 is that the adaptation circuits may be easier to build because 90° hybrid couplers are commercially available. Note that R0 is 50 ohm in the embodiment of FIG. 6.

Figure 7:
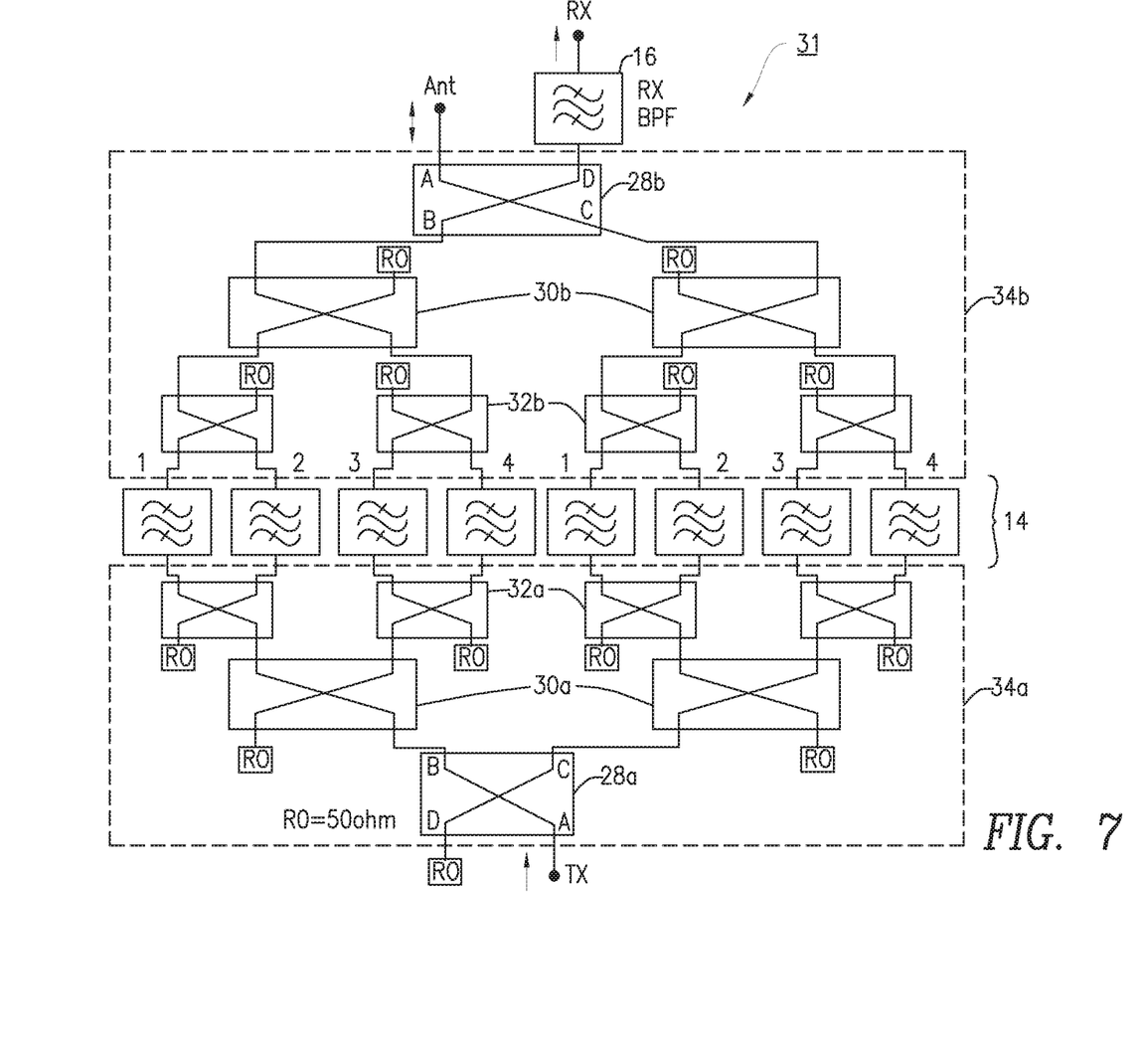
FIG. 7 is a schematic of an embodiment of a three-stage coupler type balanced duplexer having $2^3$ acoustic wave BPFs.

FIG. 7 is a schematic diagram of one embodiment of a three-stage coupler type balanced duplexer 31 using $2^3$ transmit BPFs 14 between two adaptation circuits 34a and 34b. The adaptation circuits 34a and 34b are exemplary specific implementations of the coupler modules 12a and 12b. Adaptation circuit 34a has three stages of 90° hybrid couplers 28a, 30a and 32a. Adaptation circuit 34b also has three stages of 90° hybrid couplers 28b, 30b and 32b. This configuration provides about $2^3=8$ times the power handling capability of the configuration of FIG. 1. Note that R0 is 50 ohm in the embodiment of FIG. 7.

Figure 8:
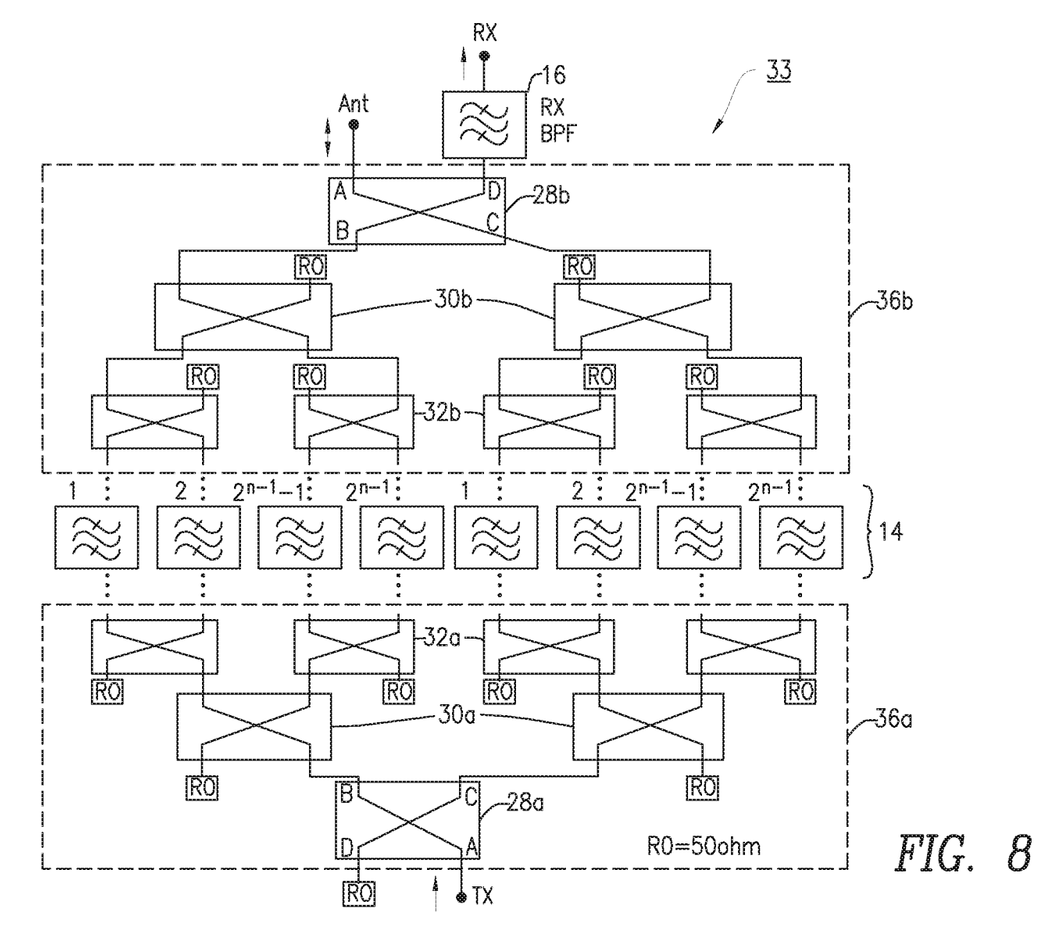
FIG. 8 is a schematic of an embodiment of an n-stage coupler type balanced duplexer having $2^n$ acoustic wave BPFs.

FIG. 8 is a schematic diagram of one embodiment of an n-stage coupler balanced duplexer 33, using $2^n$ transmit BPFs 14 and having n stages of 90° hybrid couplers 28a. 30a, and 32a, in a first adaptation circuit 36a and having n stages of 90° hybrid couplers 28b, 30b and 32b, in a second adaptation circuit 36b. The adaptation circuits 36a and 36b are exemplary specific implementations of the coupler modules 12a and 12b. The configuration of FIG. 8 is an extension of the configuration of FIG. 7 from three stages to n stages of 90° hybrid couplers. Because the configuration of FIG. 8 has about $2^n$ times the number of BPFs as the configuration of FIG. 1, the configuration of FIG. 8 has $2^n$ times the power handling as the configuration of FIG. 1. The configuration of FIG. 8 may also provide improved transmit-receive (Tx-Rx) isolation and PIM reduction at the receive port D of the hybrid coupler 28b. Note that R0 is 50 ohm in the embodiment of FIG. 8.

Figure 9:
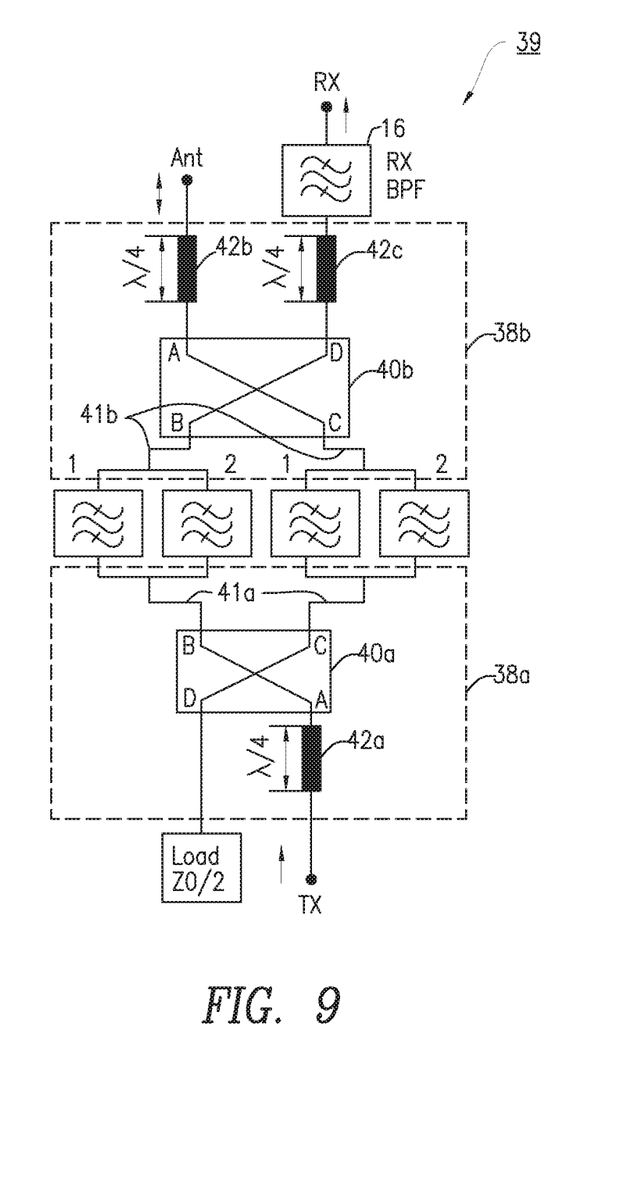
FIG. 9 is a schematic of an embodiment of a duplexer using quarter wave transmission lines for impedance matching.

FIG. 9 is a schematic diagram of one embodiment of a balanced duplexer design 39 having four transmit BPFs 14 between two adaptation circuits 38a and 38b. The adaptation circuits 38a and 38b are exemplary specific implementations of the coupler modules 12a and 12b. The configuration of FIG. 9 is especially adapted to handle BPFs with a characteristic impedance different than 50 ohms, generally designated as $Z_0$. FIG. 9 shows a load with an impedance of $Z_0/2$. It is understood, however, that the load impedance need not be exactly $Z_0/2$ and that reference to a load impedance of $Z_0/2$ is approximate. The adaptation circuit 38a has a $Z_0/2$ ohm 90° hybrid coupler 40a connected to a load with impedance of $Z_0/2$ ohms at port D and a quarter wave transmission line 42a, where $Z_0$ is the characteristic impedance of the transmit BPFs 14. Splitters 41a split the outputs B and C of the 90° hybrid coupler 40a to the inputs of the four transmit BPFs 14. The adaptation circuit 38b has combiners 41b that combine the outputs of the transmit BPFs 14 and input the combined signals to a $Z_0/2$ ohm 90° hybrid coupler 40b. The output ports A and D of the 90° hybrid coupler 40b are input to quarter wave transmission lines 42b and 42c. The duplexer 39 has about four times the power handling capability as the configuration of FIG. 1, with improvement in the Tx-Rx ports isolation and PIM reduction at the receive (Rx) port.

In FIG. 9, if the antenna load impedance is $Z_{l1}$, the receiver load impedance is $Z_{l2}$, and the characteristic impedance of the hybrid coupler 40b is $Z_0/2$, and the characteristic impedance of the transmit BPFs is $Z_0$, then the characteristic impedance of the quarter wave transmission line 42b is $$\sqrt{\frac{Z_o * Zl1}{2}}$$

and the characteristic impedance of the quarter wave transmission line 42c is $$\sqrt{\frac{Z_o * Zl2}{2}}.$$

If the input impedance of the transmitter is $Z_{in}$, then the characteristic impedance of the quarter wave transmission line 42a is $$\sqrt{\frac{Zin * Zo}{2}}.$$

Note also that the characteristic impedance of the receiver BPF 16 is $Z_{l2}$ so that the quarter wave transmission line 42c matches the port impedances of the port D of the coupler 40b and the receiver BPF. An advantage of the configuration of FIG. 9 is a simpler configuration as compared with others because the splitter 41a and the combiner 41b are comprised of just three transmission lines in a Y shape.

Figure 10:
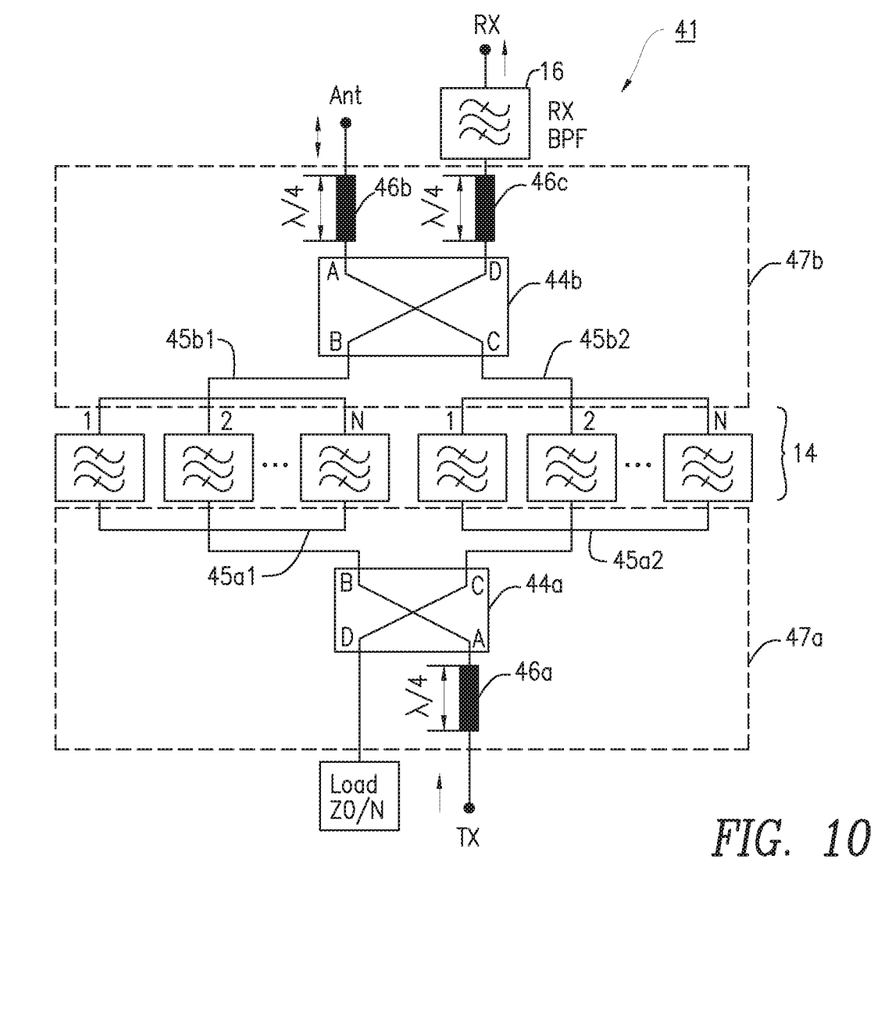
FIG. 10 is a schematic of an embodiment of a duplexer using quarter wave transmission lines for impedance matching and having 2N acoustic wave BPFs.

FIG. 10 is a schematic diagram of one embodiment of duplexer 41 having 2N transmit BPFs 14 between first and second adaptation circuits 47a and 47b. The adaptation circuits 47a and 47b are exemplary specific implementations of the coupler modules 12a and 12b. The embodiment of FIG. 10 is an extension of the embodiment of FIG. 9 to 2N transmit BPFs. FIG. 10 shows a load with an impedance of $Z_0/N$. It is understood, however, that the load impedance need not be exactly $Z_0/N$ and that reference to a load impedance of $Z_0/N$ is approximate. The first adaptation circuit 47a has a 90° hybrid coupler 44a having a characteristic impedance $Z_0/N$, splitters 45a1 and 45a2, referred to herein collectively as splitters 45a, and a quarter wave transmission line 46a having an impedance of $$\sqrt{\frac{Zin * Zo}{N}}.$$

The second adaptation circuit 47b has a 90° hybrid coupler 44b having a characteristic impedance $Z_0/N$, combiners 45b1 and 45b2, referred to herein collectively as combiners 45b, a first quarter wave transmission line 46b having a characteristic impedance of $$\sqrt{\frac{Zo * Zl1}{N}},$$

and a second quarter wave transmission line 46c having a characteristic impedance of.

$$\sqrt{\frac{Zo * Zl2}{N}},$$

where $Z_{l1}$ is the load impedance of the antenna and $Z_{l2}$ is the load impedance of the receiver. Note also that the characteristic impedance of the receiver BPF 16 is $Z_{l2}$. The configuration of FIG. 10 has about 2N times the power handling capability as the configuration of FIG. 1, because of the use of 2N times the number of transmit BPF filters. Note further that the splitters and combiners 22 of FIG. 5 are different from the splitters and combiners 45 of FIG. 10. The splitters and combiners 22 may be a circuit component such as a Wilkinson type power divider or combiner, whereas the splitters and combiners 45 may be just a set of transmission lines joined at a node.

Figure 11:
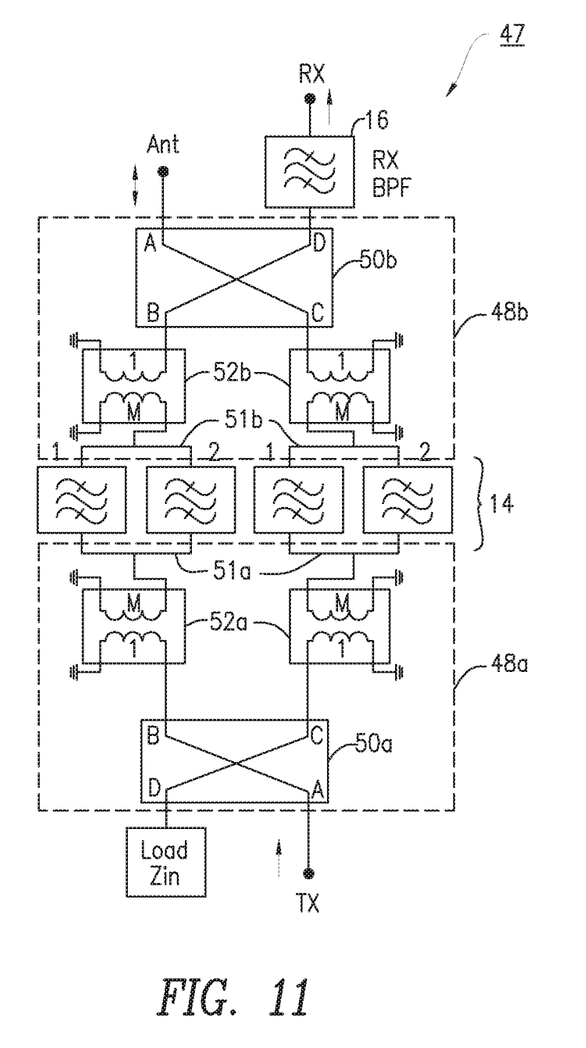
FIG. 11 is a schematic of an embodiment of a duplexer using transformers for impedance matching.

FIG. 11 is a schematic diagram of one embodiment of a duplexer 47 having four transmit BPFs 14 between adaptation circuits 48a and 48b. The adaptation circuits 48a and 48b are exemplary specific implementations of the coupler modules 12a and 12b. Each BPF has a characteristic impedance of $Z_0$. The adaptation circuit 48a has a 90° hybrid coupler 50a having a characteristic impedance $Z_{in}$ matching the input impedance of the transmitter. It is understood, however, that the load impedance need not be exactly $Z_{in}$ and that reference to a load impedance of $Z_{in}$ is approximate. Two 1:M transformers 52a, each having a turns ratio of $$M = \sqrt{\frac{Zo}{2 * Zin}},$$

couples the outputs of the 90° hybrid coupler 50a to splitters 51a and matches the impedance of the transmit BPFs 14 to the impedance of the 90° hybrid coupler 50a. The outputs of the splitters 51a are input to the 4 transmit BPFs 14. The outputs of the transmit BPFs 14 are input to the combiners 51b which combine the outputs for input to the two M:1 transformers 52b. The two M:1 transformers 52b have a turns ratio $$\sqrt{\frac{Zo}{2 * Zl}}$$

where $Z_l$ is the impedance of the antenna and the characteristic impedance of the 90° hybrid coupler 50b. The power handling capabilities of the duplexer of FIG. 11 is about four times the power handling capability of the duplexer of FIG. 1, because of the use of four transmit BPFs. An advantage of using transformers for impedance matching, rather than the quarter wave transmission lines of FIG. 10, is that transformers 52 may be low cost components and are usually commercially available. However, for some values of M, the transformers 52 may need to be specifically designed and may not be commercially available. Transformer design is known to those of skill in the art and beyond the scope of this disclosure.

Figure 12:
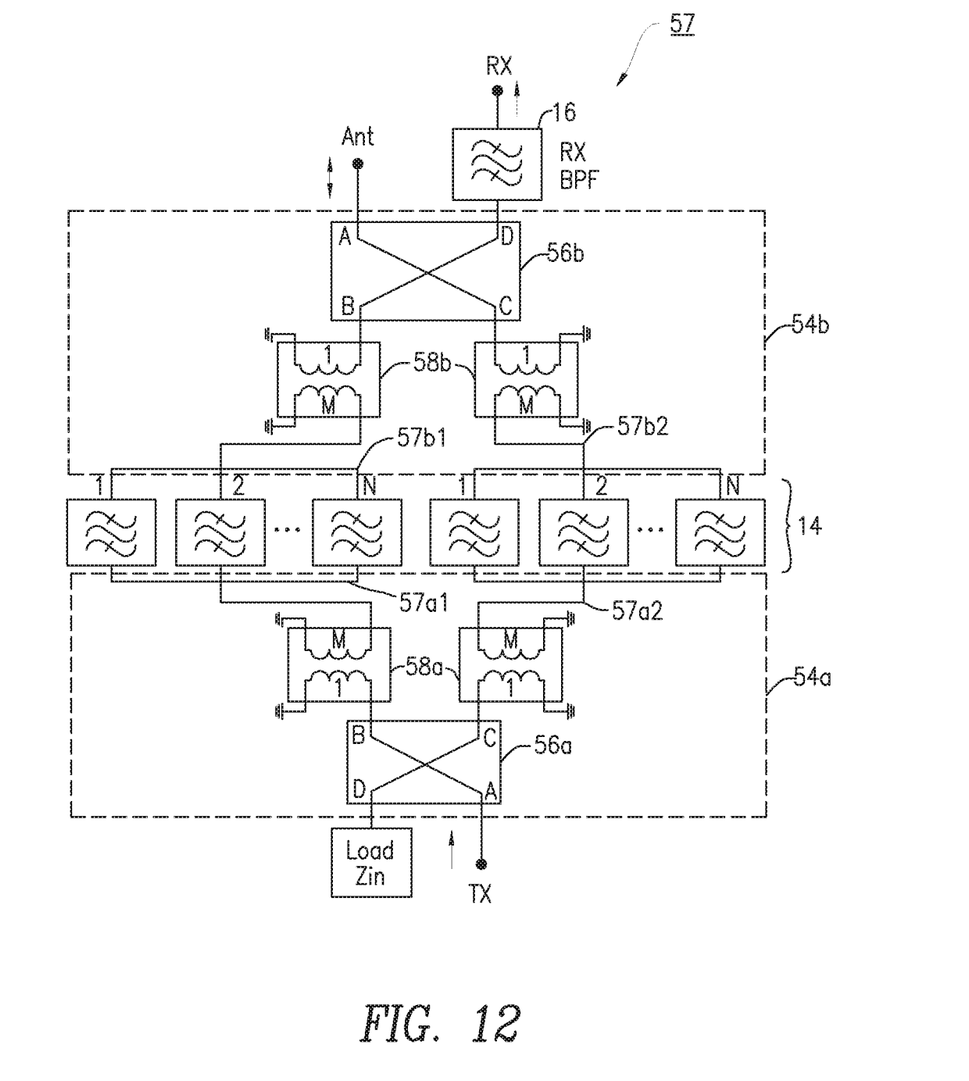
FIG. 12 is a schematic of an embodiment of a duplexer using transformers for impedance matching and having 2N acoustic wave BPFs.

FIG. 12 is a schematic diagram of one embodiment of a duplexer 57 having first and second adaptation circuits 54a and 54b with 2N transmit BPFs 14 in between. The adaptation circuits 54a and 54b are exemplary specific implementations of the coupler modules 12a and 12b. The configuration of FIG. 12 is an extension of the configuration of FIG. 11 to 2N transmit BPFs. Each BPF has a characteristic impedance of $Z_0$. The adaptation circuit 54a has a 90° hybrid coupler 56a having a characteristic impedance $Z_{in}$ matching the input impedance of the transmitter. It is understood, however, that the load impedance need not be exactly $Z_{in}$ and that reference to a load impedance of $Z_{in}$ is approximate. Two 1:M transformers 58a, each having a turns ratio of $$M = \sqrt{\frac{Zo}{N * Zin}},$$

couple the outputs of the 90° hybrid coupler 56a to 1:M splitters 57a1 and 57a2, referred to herein collectively as splitters 57a, and match the impedance of the transmit BPFs 14 to the impedance of the 90° hybrid coupler 56a. The outputs of the splitters 57a are input to the 2N transmit BPFs 14. The outputs of the transmit BPFs 14 are input to the M:1 combiners 57b1 and 57b2, referred to collectively herein as combiners 57*b* which combine the outputs for input to the two M:1 transformers 58*b*. The two M:1 transformers 58*b* have a turns ratio $$\sqrt{\frac{Zo}{N*Zl}}$$

where $Z_l$ is the impedance of the antenna and the impedance of the 90° hybrid coupler 56*b*, and also the impedance of the receive BPF 16 or the receiver load impedance. The power handling capabilities of the duplexer of FIG. 12 is 2N times the power handling capability of the duplexer of FIG. 1, and improved Tx-Rx ports isolation and PIM reductions at the receive port may be achieved.

Note that the embodiments of FIGS. 3-12 generally all have greater power handling capabilities than the configurations of FIGS. 1 and 2, and generally achieve higher Tx-Rx ports isolation and PIM reduction at the receive port. Note also that, because the BPFs are acoustic wave filters, low cost, small size and light weight duplexers can be achieved. Different types of 90° hybrid couplers may be used including hybrid couplers having different characteristic impedances. Further, the embodiments of FIGS. 9-12 may be used to match different impedances of the receiver, transmitter, and transmit BPFs. Impedance matching is generally desirable to reduce standing wave ratios and to increase power transfer across the duplexer.

It will be appreciated by persons skilled in the art that embodiments are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A duplexer, comprising:
   2N band pass filters, N being an integer greater than 1, the 2N band pass filters each having an input and an output and each having a characteristic impedance of $Z_0$ ohms, the 2N band pass filters being in an electrically parallel configuration;
   a first adaptation circuit configured to couple a transmit signal received from a transmitter to each one of the 2N band pass filters, the first adaptation circuit including:
      a first 90° hybrid coupler having at least one input and at least two outputs and configured to couple the transmit signal toward the 2N band pass filters, the first 90° hybrid coupler having an impedance of $Z_0/N$ ohms;
      a first quarter-wave transmission line coupled to the at least one input of the first 90° hybrid coupler, the first quarter-wave transmission line having a characteristic impedance of $\sqrt{(Z_{in}*Z_o)/N}$ ohms, where $Z_{in}$ is an input impedance of the transmitter; and
   a second adaptation circuit configured to couple outputs of the 2N band pass filters to an antenna, the second adaptation circuit providing a reflective path between the antenna and a receiver.

2. The duplexer of claim 1, wherein the first adaptation circuit further includes a splitter circuit configured to direct an output of the 90° hybrid coupler to each of a plurality of the 2N band pass filters.

3. The duplexer of claim 2, wherein the splitter circuit includes a first splitter having N output ports and a second splitter having N output ports, each splitter receiving as an input an output of the first 90° hybrid coupler.

4. The duplexer of claim 1, wherein the second adaptation circuit includes a second 90° hybrid coupler configured to receive outputs of the 2N band pass filters, and to couple the received outputs to the antenna.

5. The duplexer of claim 4, wherein the second adaptation circuit includes a combiner circuit having a plurality of input ports, each input port receiving an output of one of a plurality of the 2N band pass filters.

6. The duplexer of claim 5, wherein the first combiner circuit includes a first combiner having N input ports coupled to a first set of N output ports of the 2N band pass filters.

7. The duplexer of claim 6, wherein the first combiner circuit includes a second combiner having N input ports coupled to a second set of N output ports of the 2N band pass filter.

8. The duplexer of claim 1, wherein the band pass filters are acoustic wave band pass filters.

9. The duplexer of claim 1, wherein the band pass filters are low temperature co-fired ceramic, LTCC, filters.

10. A duplexer configured to couple a transmitter to an antenna, and to couple the antenna to a receiver, the duplexer comprising:
   2N band pass filters, N being an integer greater than 1, the 2N band pass filters each having an input and an output and each having a characteristic impedance of $Z_0$, the 2N band pass filters being in an electrically parallel configuration;
   a first adaptation circuit configured to couple the transmitter to each one of the 2N band pass filters, the first adaptation circuit comprising:
      a first 90° hybrid coupler having at least one input and at least two outputs, the first 90° hybrid coupler having an impedance of $Z_0/N$;
      a first quarter-wave transmission line coupled to the at least one input of the first 90° hybrid coupler, the first quarter-wave transmission line having a characteristic impedance of $\sqrt{(Z_{in}*Z_0)/N}$, where $Z_{in}$ is an input impedance of the transmitter;
      a first splitter having an input and N outputs, the input of the first splitter being coupled to a first one of the at least two outputs of the first 90° hybrid coupler, and the N outputs of the first splitter being coupled to the inputs of a first set of N of the 2N band pass filters; and
      a second splitter having an input and N outputs, the input of the second splitter being coupled to a second one of the at least two outputs of the first 90° hybrid coupler, and the N outputs of the second splitter being coupled to the inputs of a second set of N of the 2N band pass filters; and
   a second adaptation circuit configured to couple each one the 2N band pass filters to the antenna, the second adaptation circuit configured to provide a reflective path between the antenna and the receiver, the second adaptation circuit comprising:
      a second 90° hybrid coupler having at least two inputs and at least two outputs, the second 90° hybrid coupler having an impedance of $Z_0/N$;
      a second quarter-wave transmission line coupled to a first one of the at least two outputs of the second 90° hybrid coupler, the second quarter-wave transmission line having a characteristic impedance of $\sqrt{(Z_{in}*Z_{l1})/N}$, where $Z_{l1}$ is a load impedance of the antenna;

a third quarter-wave transmission line coupled to a second one of the at least two outputs of the second 90° hybrid coupler, the third quarter-wave transmission line having a characteristic impedance of $\sqrt{(Z_{in}*Z_{l2})/N}$, where $Z_{l2}$ is a load impedance of the receiver;

a first combiner having N inputs and an output, the N inputs of the first combiner being coupled to the outputs of the first set of N of the 2N band pass filters, and the output of the first combiner being coupled to a first one of the at least two inputs of the second 90° hybrid coupler; and a second combiner having N inputs and an output, the N inputs of the second combiner being coupled to the outputs of the second set of N of the 2N band pass filters, and the output of the second combiner being coupled to a second one of the at least two inputs of the second 90° hybrid coupler.

11. The duplexer of claim 10, wherein the band pass filters are acoustic wave band pass filters.

12. The duplexer of claim 10, wherein the band pass filters are low temperature co-fired ceramic, LTCC, filters.

* * * * *